US012727074B2

(12) United States Patent
Clark et al.

(10) Patent No.: US 12,727,074 B2
(45) Date of Patent: Sep. 1, 2026

(54) TRANSMISSION LINE POWER DIVIDERS AND POWER COMBINERS WITH MATCHED PORTS

(71) Applicant: L3 TECHNOLOGIES, INC., New York, NY (US)

(72) Inventors: Brian Christopher Clark, Plano, TX (US); Kris Allen Skowronski, McKinney, TX (US)

(73) Assignee: L3Harris Technologies, Inc., Melbourne, FL (US)

( * ) Notice: Subject to any disclaimer, the term of this patent is extended or adjusted under 35 U.S.C. 154(b) by 186 days.

(21) Appl. No.: 18/676,296

(22) Filed: May 28, 2024

(65) Prior Publication Data

US 2024/0314925 A1 Sep. 19, 2024

Related U.S. Application Data

(62) Division of application No. 17/008,375, filed on Aug. 31, 2020, now Pat. No. 12,022,609.

(51) Int. Cl.
*H05K 1/02* (2006.01)
*H01P 3/08* (2006.01)

(52) U.S. Cl.
CPC ............... *H05K 1/025* (2013.01); *H01P 3/08* (2013.01); *H05K 2201/09236* (2013.01); *H05K 2201/09254* (2013.01)

(58) Field of Classification Search
CPC ................................. H05K 1/025; H01P 3/08
See application file for complete search history.

(56) References Cited

U.S. PATENT DOCUMENTS 3,091,743 A 5/1963 Wilkinson
3,815,055 A 6/1974 Plunk et al.
4,450,418 A 5/1984 Yum et al.
5,455,546 A 10/1995 Frederick et al.
5,662,816 A * 9/1997 Andry .................... H01P 3/081 428/209
8,319,583 B2 11/2012 Huettner
12,022,609 B2 6/2024 Clark et al.
2011/0043301 A1 2/2011 Huettner
(Continued)

OTHER PUBLICATIONS

Wikipedia, “Power Dividers and Directional Couplers”, Obtained from Internet Oct. 16, 2019, 20 pgs.
(Continued)

*Primary Examiner* — Samuel S Outten
(74) *Attorney, Agent, or Firm* — Egan, Enders & Huston LLP.

(57) ABSTRACT

Power dividers (or splitters) and power combiners may be implemented using distributed lossy transmission lines that dissipate radio frequency (RF) and other electromagnetic (EM) signal energy. By taking advantage of natural PCB board loss at high operating frequencies, N-way power dividers with matched outputs and good isolation may be implemented without the use of discrete resistors. In one embodiment, a N-way power divider may be at least partially implemented on buried printed circuit board (PCB) layers (e.g., partially embedded) and, in a further embodiment a N-way may be implemented in a manner that is completely internal to the PCB (e.g., completely embedded), without the use of discrete resistors.

26 Claims, 8 Drawing Sheets

(56) References Cited

U.S. PATENT DOCUMENTS

| | | | |
|---|---|---|---|
| 2019/0020093 | A1 | 1/2019 | Zavadsky et al. |
| 2019/0273315 | A1 | 9/2019 | Hu et al. |
| 2022/0070997 | A1 | 3/2022 | Clark et al. |

OTHER PUBLICATIONS

Wikipedia, "Wilkinson Power Divider", Obtained from Internet Oct. 16, 2019, 4 pgs.
Microwaves101, "Wilkinson Power Splitters", Nov. 1, 2019, 7 pgs.
Microwaves 101, "Unequal-Split Power Divider Calculator", Aug. 19, 2020, 2 pgs.
Microwaves 101, "N-way Wilkinson Splitters", Nov. 1, 2019, 8 pgs.
Microwaves 101, "Gysel Power Splitter", Oct. 16, 2019, 13 pgs.
Microwaves 101, "Gysel Even/Odd Mode Analysis", Aug. 23, 2020, 5 pgs.
Ashvin et al., "Design of Corporate Feed Network Using Wilkinson Power Divider", JETIR, vol. 2, Issue 3, Mar. 2015, pp. 555-558 (4 pgs. ).
Gysel, "A New N-Way Power Divider/Combiner Suitable for High-Power Applications", IEEE MTT-S Internaitonal Microwave Symposium, 1975, 3 pgs.
Wilkinson, "An N-Way Hybrid Power Divider", IRE Transactions on Microwave Theory and Techniques, 1959, 3 pgs.
Wikipedia, "Transmission Line", Captured from the Internet on Aug. 26, 2020, 16 pgs.

* cited by examiner 300
310
290
AMP
300
N-WAY
POWER
DIVIDER
320₁
RX₁
320₂
RX₂
RX₃
320₃
RX₄
320₄
RXN
320N 410₁
410₂
410₃
410₄
410N
290₁
A₁
290₂
A₂
290₃
A₃
290₄
A₄
290N
AN
N-WAY
POWER
COMBINER
400
RX
420

TRANSMISSION LINE POWER DIVIDERS AND POWER COMBINERS WITH MATCHED PORTS

This application is a divisional of pending U.S. patent application Ser. No. 17/008,375, filed on Aug. 31, 2020 and entitled "Transmission Line Power Dividers And Power Combiners With Matched Ports" which is incorporated by reference herein in its entirety and for all purposes.

FIELD

This invention relates generally to electronic circuits and, more particularly, to microwave power divider and power combiner circuitry.

BACKGROUND

Due to physical limitations, a three-port microwave network cannot be lossless, reciprocal, and impedance-matched at all ports without violating conservation of energy. However, four-port passive microwave networks can be lossless, reciprocal, and impedance-matched at all ports, in which case one of the four ports will be isolated from the input (a directional coupler). A simple T-Junction power splitter having one input port electrically connected to two output ports is the most basic three-port network. A quarter-wave section with characteristic impedance $\sqrt{2}Z_0$ at the fundamental frequency ($f_0$) may be electrically coupled as an impedance transformer between the input port and each output port of the T-junction power splitter to provide a matched input for such a power splitter, but the output ports will not be matched, causing microwave energy to be reflected back from each output port in the reverse excitation case due to asymmetry between the output ports.

N-port power dividers are used to divide a single microwave or other type radio frequency (RF) input signal into two or more output signals. N-port power combiners are used to combine two or more RF input signals into one output signal. Both N-port power dividers and N-port power combiners require their output port/s to be non-isolated from their input port/s, and thus have the same physical limitations as a three-port microwave network. This means that N-port passive power dividers and N-port passive power combiners must include some power loss in order to achieve an impedance-matched condition at all ports.

Wilkinson and Gysel power dividers both use discrete lumped resistors to achieve an impedance-matched condition, and selection of discrete resistance values may be made to improve isolation between power divider output ports. For example, in the case of a Wilkinson power divider, a discrete lumped resistor is placed between the power outputs to match the power outputs as well as to provide isolation between them. Matching all ports of an N-port power divider or power combiner that is laid out on the external surface of a printed circuit board (PCB) is required to prevent reflections which cause standing waves between components on the PCB. With increasing signal frequencies, discrete packaged resistors and their interconnects on the PCB become electrically large and the conventional Wilkinson design has degraded performance, requiring other bulky power divider solutions in the form of surface mount chips or a waveguide.

Even-Odd mode analysis can be performed on a Wilkinson power divider with a discrete resistor to compare performance when the input and output ports are excited. It can be shown that the output ports are matched in both modes, with the discrete resistor providing the match in the odd mode. In the even mode, when the input port is excited or the output ports are excited equally with the same polarity, the voltage is equal on the opposite output arms, preventing current from flowing through the resistor. The resistor section appears to be open circuited halfway through the resistor and has no effect on the match. In the odd mode, if the output ports have opposite polarity excitations, there is a voltage null at the bisection of the splitter, which can be modeled as a short to ground. The resistor section appears to be short circuited halfway through the resistor. Since the quarter-wave impedance transformer is also shorted, it appears as an open circuit one-quarter wavelength along the line, at the top of the discrete resistor. Therefore the discrete resistor absorbs the full current, providing a matched output and isolation for each output port from the other output port.

SUMMARY

Disclosed herein are N-way passive power dividers and combiners that may be implemented using distributed lossy transmission lines that dissipate radio frequency (RF) and other electromagnetic (EM) signal energy. By taking advantage of natural PCB board loss at high operating frequencies, one embodiment of N-way power dividers and combiners with matched outputs and good isolation may be implemented without the use of discrete resistors. In one embodiment, a the disclosed N-way power dividers and combiners may be at least partially implemented on buried printed circuit board (PCB) layers (e.g., at least partially embedded within a PCB) without the use of discrete resistors. In a further embodiment an N-way power divider or power combiner may be implemented in a manner that is completely internal to the PCB (e.g., completely embedded within a PCB), without the use of discrete resistors. In such an embodiment, no discrete resistive element components are present and such that no PCB surface real-estate is required, and such that the disclosed N-way power divider and power combiner designs are frequency scalable. In another embodiment, the disclosed N-way power dividers and power combiners may be advantageously implemented without interconnects required for surface mount parts and without embedded resistive layers that limit the useable frequency and increase board fabrication complexity.

It will be understood that N-way power dividers and combiners disclosed herein may also be referred to as an "N-port" power divider or combiner, depending on whether the common port is included in the variable count "N" for a given divider or combiner. In this regard, the variable "N" in the term "N-port power divider" refers to the total number of ports of the divider, including the common input port. The variable "N" in the term "N-port power combiner" refers to the total number of ports of the combiner, including the common output port. The variable "N" in the term "N-way power divider" refers to the total number of output ports of the divider, and therefore does not include the common input port. The variable "N" in the term "N-way power combiner" refers to the total number of input ports of the combiner, and therefore does not include the common output port. It will also be understood that the N-way power dividers and combiners described herein may be implemented such that "N" is any integer number greater than or equal to 2, and that an N-way power divider circuit may be alternatively implemented as an N-way power combiner (and vice-versa) by reversing the signal directions through the circuit, e.g., such that the N output ports of a N-way power divider become input ports of a corresponding N-way power combiner, and such that the input port of the N-way power divider becomes an output port of the N-way power combiner.

In one embodiment, N-way power dividers and power combiners are disclosed that may be implemented on or within a PCB using distributed lossy transmission lines which rely on natural PCB dielectric and conductive material losses and resulting EM signal dissipation exhibited by the distributed lossy transmission lines to achieve good isolation and output match of all divider or combiner ports without the presence of discrete resistor elements between output ports (or between input ports) that take up external surface area on the printed circuit board in conventional power divider and power combiner designs. In such an embodiment, reflections and resulting standing waves between the power divider/combiner and components connected to the N-way power divider/combiner may be minimized or prevented without the presence of discrete resistor element components between outputs or between inputs and without the accompanying need for dedicating board outer surface area to mount or otherwise place such resistors. Without the presence of discrete resistor element components, the disclosed power dividers and combiners may be scaled with frequency and do not require the increased resistor board external surface area for microwave frequencies (e.g., microwave frequencies of from 300 MHz to 300 GHz in one embodiment) in the manner that is required by conventional combiners and dividers that require presence of such discrete resistor element components (i.e., packaged resistors and their interconnects). In this regard, conventional discrete resistor element components require outer surface area on the PCB board and become less effective at microwave frequencies when a package is electrically large.

One embodiment of the disclosed systems and methods may be implemented to provide N-way power dividers and power combiners that take advantage of naturally-occurring conductive and dielectric losses in PCB material at microwave operating frequencies (e.g., signal frequencies greater than or equal to 1 GHz, and alternatively from 1 GHz up to 300 GHz) during transmission of an EM signal through layers of the PCB material, it being understood however that the disclosed N-way power dividers and power combiners may be implemented in other embodiments for lower frequency signals, e.g., less than 1 GHz, and alternatively from less than 1 GHz down to 300 MHz. The above-described naturally-occurring conductive and dielectric losses (including losses due to conductor surface roughness) may be utilized in one exemplary embodiment to create a distributed lossy transmission line within the PCB material that has a total equivalent resistance equal to the resistance used in a conventional Wilkinson divider design, but without the need for (and without the presence of) any discrete resistor element components. Such a distributed lossy transmission line may be used in one embodiment to provide N-way power dividers and power combiners having matched outputs and inputs together with good output and input isolation for high operating frequency signals. In one exemplary embodiment, such N-way power dividers and combiners may be so implemented completely internal to the PCB, and without the use or presence of discrete resistor components.

In addition to Wilkinson power dividers and power combiners, other embodiments are possible. For example, other embodiments of the disclosed systems and methods may employ distributed lossy transmission lines of buried printed circuit board (PCB) layers to implement N-way unequal-split power dividers and combiners, Gysel (wider bandwidth) dividers and combiners, Kouzoujian dividers and combiners, and other resistive dividers and combiners.

In one respect, disclosed herein is a circuit, including: an input arm defined as an electrically-conductive transmission line on or within a printed circuit board (PCB); multiple output arms electrically coupled to the input arm, each of the multiple output arms being defined as a separate electrically-conductive transmission line on or within the PCB; and multiple impedance transformers defined as separate respective electrically-conductive transmission lines on or within the PCB. The circuit may further include either one of: at least one resistive shunt electrically coupled between each one of the multiple output arms and each of the other multiple output arms, the resistive shunt being one or more electrically-conductive transmission lines defined on or within the PCB, and each of the impedance transformers being electrically coupled between a respective one of the multiple output arms and the input arm, or at least one resistive shunt electrically coupled between each one of the multiple output arms and a ground plane of the PCB, the resistive shunt being one or more electrically-conductive transmission lines defined on or within the PCB, and each of the impedance transformers being electrically coupled between a respective one of the resistive shunts and the input arm.

In another respect, disclosed herein is a system, including: a planar printed circuit board (PCB); a power divider circuit including: an input arm defined as an electrically-conductive transmission line on or within the PCB and the input arm providing an input port for the power divider circuit, multiple output arms electrically coupled to the input arm with each of the multiple output arms being defined as a separate electrically-conductive transmission line on or within the PCB and each of the multiple output arms providing a separate and different output port for the power divider circuit, and multiple impedance transformers defined as separate respective electrically-conductive transmission lines on or within the PCB; and at least one power source. The power divider circuit may further include either one of: at least one resistive shunt electrically coupled between each one of the multiple output arms and each of the other multiple output arms, the resistive shunt being one or more electrically-conductive transmission lines defined on or within the PCB, and each of the impedance transformers being electrically coupled between a respective one of the multiple output arms and the input arm, or at least one resistive shunt electrically coupled between each one of the multiple output arms and a ground plane of the PCB, the resistive shunt being one or more electrically-conductive transmission lines defined on or within the PCB, and each of the impedance transformers being electrically coupled between a respective one of the resistive shunts and the input arm. In the disclosed systems, either one of the following is possible: the at least one power source is electrically coupled to the input port of the power divider circuit and providing input power to the input port of the power divider circuit, and a separate and different additional circuit electrically-coupled to each given one of the separate and different output ports of the power divider circuit and receiving a portion of the provided input power from the given one of the separate and different output ports of the power divider circuit, or the at least one power source includes a separate and different power source electrically-coupled to each given one of the separate and different output ports of the power divider circuit and providing input power to the given one of the separate and different output ports of the power divider circuit, and an additional circuit electrically-coupled to the input port of the power divider circuit and receiving at the input port of the power divider circuit a combination of the input power provided to each given one of the separate and different output ports of the power divider circuit.

In another respect, disclosed herein is a method, including either one of: providing input power to an input port of a power divider circuit, and receiving a portion of the provided input power from each given one of multiple separate and different output ports of the power divider circuit; or providing input power to each given one of the multiple separate and different output ports of the power divider circuit, and receiving at the input port of the power divider circuit a combination of the input power provided to each given one of the multiple separate and different output ports of the power divider circuit. The power divider circuit may include: an input arm including the input port and defined as an electrically-conductive transmission line on or within a printed circuit board (PCB), multiple output arms including the multiple respective output ports of the power divider and being electrically coupled to the input arm, each of the multiple output arms being defined as a separate electrically-conductive transmission line on or within the PCB, and multiple impedance transformers defined as separate respective electrically-conductive transmission lines on or within the PCB. The power divider circuit may further include either one of: at least one resistive shunt electrically coupled between each one of the multiple output arms and each of the other multiple output arms, the resistive shunt being one or more electrically-conductive transmission lines defined on or within the PCB, and each of the impedance transformers being electrically coupled between a respective one of the multiple output arms and the input arm, or at least one resistive shunt electrically coupled between each one of the multiple output arms and a ground plane of the PCB, the resistive shunt being one or more electrically-conductive transmission lines defined on or within the PCB, and each of the impedance transformers being electrically coupled between a respective one of the resistive shunts and the input arm.

DESCRIPTION OF ILLUSTRATIVE EMBODIMENTS

Figures 1A, 1B:
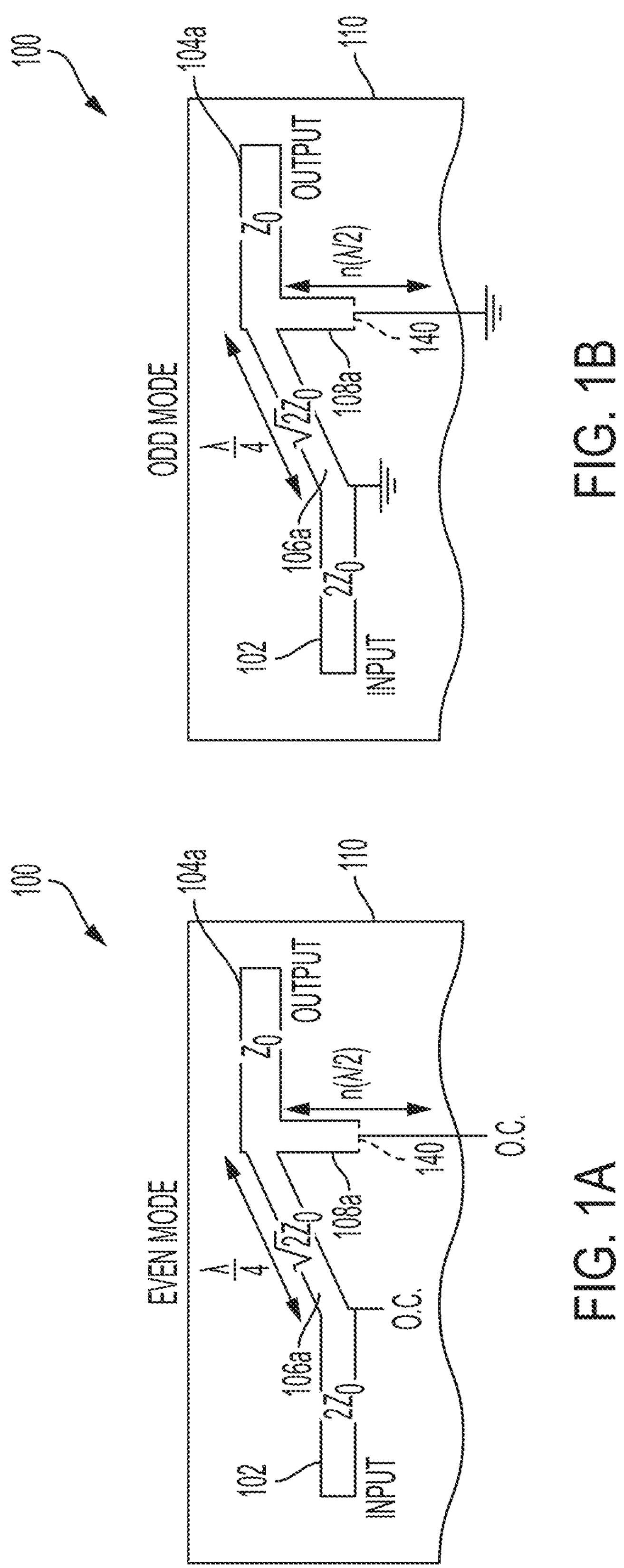
FIG. 1A illustrates an overhead view of a portion of a two-way power divider according to one exemplary embodiment of the disclosed systems and methods.
FIG. 1B illustrates an overhead view of a portion of a two-way power divider according to one exemplary embodiment of the disclosed systems and methods.
Figure 1C:
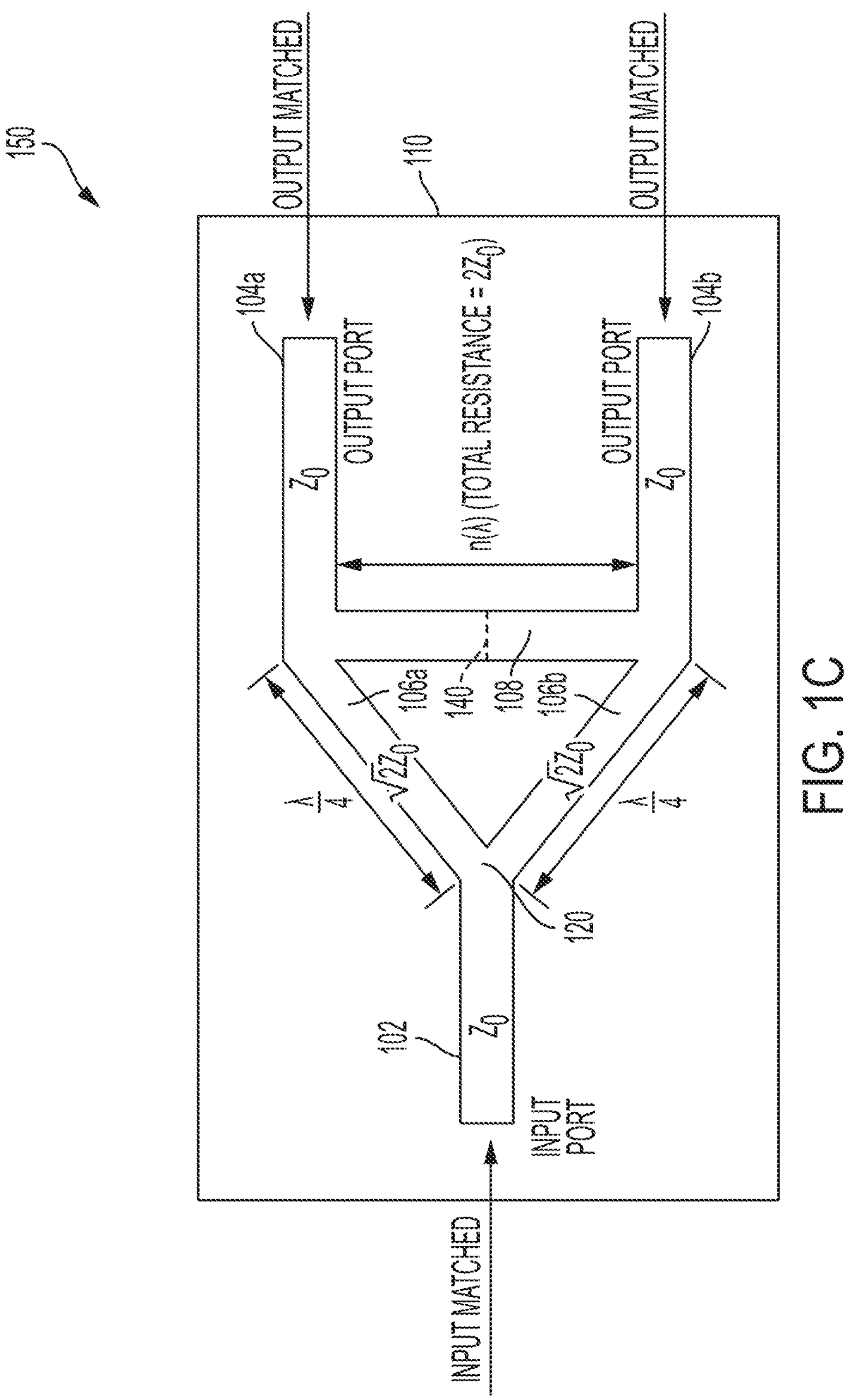
FIG. 1C illustrates an overhead view of a two-way power divider according to one exemplary embodiment of the disclosed systems and methods.

FIGS. 1A and 1B are overhead views that illustrate a bisected half circuit portion 100 of a three-port (or two-way) Wilkinson-type power divider (or splitter) as it may be implemented in one exemplary embodiment by distributed transmission lines 102, 104, 106 and 108 of a portion of a planar printed circuit board (PCB) 110 with a single input arm 102 electrically coupled by an electrically conductive impedance transformer section 106*a* to a first output arm 104*a* of two output arms of the power divider. For purpose of description a second output arm 104*b* and corresponding electrically conductive second impedance transformer section 106*b* is not shown in FIGS. 1A and 1B. However, FIG. 1C illustrates the full (non-bisected) three-port or two-way power divider circuit 150 of this embodiment with its second output arm 104*b* and second impedance transformer section 106*b* electrically coupled to input arm 102 and first impedance transformer section 106*a* at a circuit node 120. As shown in FIG. 1C, input arm 102 corresponds to an input port of the power divider circuit 150 and output arms 104*a* and 104*b* correspond to respective output ports of the same power divider circuit 150. In one embodiment, PCB 110 may be FR4 fiberglass or other suitable PCB material such as polytetrafluoroethylene (PTFE), etc.

Each of transmission lines 102, 104, 106 and 108 of a power divider circuit 150 (as well as transmission lines of other power divider circuits described herein) may be an electrical conductor that is composed of any electrically-conductive material that is suitable to conduct electrical signals between these transmission lines when electrically-coupled together as shown (e.g., with adjacent transmission lines electrically-connected to each other). Examples of such electrically-conductive materials include, but are not limited to, electrically-conductive metal such as copper or copper plated with nickel, gold or a combination of nickel and gold for purposes of corrosion resistance.

It will be understood that the input/output impedance of the divider ports (which depend on the transmission line widths) needs to match the system impedance. In one embodiment, width of transmission lines of power divider circuit 150 may be sized to yield a 50 ohm characteristic impedance at the ports to match a system impedance of 50 ohms. However, width of transmission lines of power divider circuit 150 may be sized to match other system impedances, e.g., such as 75 ohms, 100 ohms, 200 ohms, etc. For example, transmission lines of power divider circuit 150 may be sized otherwise when twin-wire transmission lines are employed which tend to have a higher characteristic impedance (e.g., 200 ohm), or when feeding antennas with input impedance other than 50 ohms. In another embodiment, transmission lines of power divider circuit 150 may be sized to have a variable width, e.g., for a 5-way divider using a 50-ohm characteristic impedance width at the ports of a 5-way divider would require a line width that may be too small to manufacture in the narrow sections, in which case the input ports may be tapered from 50 ohms down to 20 ohms before splitting to allow for wider lines to be printed.

Also shown in FIGS. 1A and 1B is first electrically conductive stub section portion 108*a* that electrically couples at a circuit node 140 to a symmetrical second electrically conductive stub section (not shown). In this embodiment, each of the first and second stub sections is implemented as a stub section portion of lossy transmission line 108 that acts as a resistive shunt that electrically couples the first output arm 104*a* to the second output arm 104*b* (as shown in overhead view of FIG. 1C), with the resistance of the resistant shunt being provided by natural dielectric and conductor losses of the overall transmission line 108, and not provided by discrete resistors that are employed in conventional solutions. In one embodiment, each of stub section portions of the resistive shunt 108 may be manufactured as a respective transmission line section of PCB 110 in the same manner (e.g., patterned and etched from the same PCB layer), and at the same time, as are other transmission line sections 102, 104, and 106. Conductive path length of the resistive shunt may be selected to give the resistive shunt a desired or selected electrical resistance. Since the transmission line of the resistive shunt 108 is manufactured at the same time and together with the other transmission lines of the PCB, there is no need for additional and/or alternative manufacturing methods and/or additional or alternative method steps to produce the resistive shunt of the PCB.

In one embodiment of FIGS. 1A-1C, input arm 102, first and second output arms 104*a* and 104*b*, impedance transformer sections 106*a* and 106*b*, and electrically conductive resistive shunt 108 of a power divider circuit 150 may each be implemented as external transmission lines (e.g., microstrips) in the same external (surface) planar routing layer of a PCB 110. However, in another embodiment, input arm 102, first and second output arms 104*a* and 104*b*, impedance transformer sections 106*a* and 106*b*, and electrically conductive resistive shunt 108 of a power divider circuit 150 may each be implemented as internal transmission lines (e.g., striplines) within the same internal planar routing layer of a PCB 110, in which case the power divider circuitry may be surrounded by dielectric (electrically insulating) PCB substrate material.

As further shown in FIGS. 1A, 1B and 1C, impedance transformer sections 106*a* and 106*b* each has a length that is one quarter of a voltage excitation wavelength $\lambda$ at the fundamental frequency ($f_0$), and the length of each of the electrically coupled stub section portion 108*a* is a multiple (n) of a half wavelength ($\lambda/2$) at the fundamental frequency ($f_0$), with the total length of electrically coupled resistive shunt 108 being a multiple (n) of a full wavelength ($\lambda$) at the fundamental frequency ($f_0$). It is noted that in FIG. 1C, the line widths of transmission lines 102, 104, and 106 may vary depending on the characteristic impedances shown in FIG. 1C (Z0, sqrt(2)*Z0, etc.), with the impedance (and line width) of transmission line 108 not being critical in one embodiment. It is also noted that the 2*Z0 value shown for resistive shunt 108 is the total resistance of the resistive shunt 108 (analagous to the resistance value), whereas the other labels reference the characteristic impedance of each section 102, 104, and 106.

In FIG. 1A, bisected half portion 100 of power divider (or splitter) circuit 150 is shown excited in the even mode, i.e., in which input arm 102 is excited by a voltage having wavelength ($\lambda$) at the fundamental frequency ($f_0$), or in which each of the first and second output arms 104*a* and 104*b* of the power divider circuit are excited equally by a voltage of the same magnitude, polarity (or phase), and wavelength ($\lambda$) at the fundamental frequency ($f_0$). In FIG. 1B, portion 100 of the power divider circuitry is shown excited in the odd mode, i.e., in which each of the first output arm 104*a* and the second output arm 104*b* of the power divider circuit are excited by a voltage of the same magnitude and wavelength ($\lambda$) at the fundamental frequency ($f_0$), but with the voltage excitation of the first output arm 104*a* being opposite in polarity (or phase) to the voltage excitation of the second output arm 104*b*. When signal direction is reversed and output arms of circuit 150 of FIGS. 1A-1C are excited, circuit 150 becomes a combiner, and any combination of magnitude/phase applied to the two output ports can be split into weighted even mode and odd mode signals. Even/odd analysis can be done separately and then superimposed to recover the combined signal (e.g., this is unnecessary in the divider case because exciting the input is analagous to the even mode).

In the even mode excitation of FIG. 1A, the bisected half circuit portion 100 of the power divider circuit 150 may be modeled as an open circuit (O.C.) and since the resistive shunt 108 has a length that is a multiple of the wavelength ($\lambda$) at the fundamental frequency ($f_0$), it will appear as an open circuit where it meets the output arm 104*a* and no "real" current will flow on it (e.g., in the ideal case only a standing wave will be present on the stub section 108). Therefore it will have no effect on the input match at the fundamental frequency ($f_0$).

In the odd mode excitation of FIG. 1B, the bisected half portion 100 of the power divider circuit may be modeled as a short circuit (e.g., as if coupled to ground) and since the resistive shunt 108 has a length that is a multiple of the full wavelength ($\lambda$) at the fundamental frequency ($f_0$), it will appear as a short circuit where it meets the first output arm 104*a*, whereas the quarter-wave impedance transformer section 106*a* will still appear as an open circuit at $f_0$. All the current will be directed through the lossy transmission line of the resistive shunt 108 so that it will take the full current load. In the case that the total length of resistive shunt 108 is sufficient to achieve a distributed resistance of twice the characteristic impedance ($2Z_0$), the energy will be completely transferred to heat.

FIG. 1C illustrates the complete (non-bisected) circuit 150 of the three-port Wilkinson power divider of the even-odd mode analysis of FIGS. 1A and 1B. In this embodiment all electrically-conductive components of circuit 150 may be implemented by transmission lines of a printed circuit board (PCB) 110. As shown, the complete three-port power divider 150 includes a single input arm 102 electrically coupled by the electrically conductive impedance transformer section 106*a* to the first output arm 104*a*, and also coupled by an electrically conductive impedance transformer section 106*b* to the second output arm 104*b*. Impedance transformer section 106*b* has a length that is one quarter of a voltage excitation wavelength k at the fundamental frequency ($f_0$), and the full electrically conductive resistive shunt 108 has a length that is a multiple (n) of a full wavelength ($\lambda$) at the fundamental frequency ($f_0$). As further shown in FIG. 1C, the full electrically conductive resistive shunt 108 is implemented as a lossy transmission line section that electrically couples the first output arm 104*a* to the second output arm 104*b*.

FIG. 1C illustrates a three-port power divider circuit 150 implemented in a common two-dimensional plane in a single internal or external PCB routing layer. However, in other embodiments a power divider may be implemented in three dimensions as an N-way power divider that includes more than three ports disposed in multiple different planes, e.g., on multiple different planar PCB routing layers having respective planes that are oriented parallel to each other, and that are separated by PCB dielectric (electrically-insulating) material. For example, such multiple PCB routing layers of a power divider circuit may include an electrically-conductive external planar routing layer on the planar PCB substrate surface and at least one additional electrically-conductive planar PCB routing layer disposed within the PCB substrate, and separated from the external routing layer by a layer of electrically-insulating dielectric PCB material.

Alternatively, multiple PCB routing layers of a power divider circuit may include a first electrically-conductive internal planar PCB routing layer disposed within the PCB substrate and at least one second and different electrically-conductive internal planar PCB routing layer disposed within the same PCB substrate but in a different plane and separated from the first internal routing layer by a layer of electrically-insulating dielectric PCB material. In yet another embodiment, it is also optionally possible that a first electrically-conductive internal or external planar PCB routing layer of a power divider circuit may additionally be separated from at least one second and different electrically-conductive internal or external planar PCB routing layer of the same power divider circuit by one or more other intervening electrically-conductive planar PCB routing layers that may include circuitry that is not part of the power divider circuit. In such an embodiment, electrically-conductive inter-layer vias may be employed to selectively route voltage, current and/or power between the power divider transmission lines of the first electrically-conductive planar PCB routing layer and the power divider transmission lines of the second electrically-conductive planar PCB routing layer.

Examples of such N-way power dividers and combiners disclosed herein include N-port power dividers and combiners having more than three ports (e.g., three to ten ports), alternatively more than four ports (e.g., four to ten ports), alternatively five or more ports (e.g., five to ten ports), alternatively six or more ports (e.g., six to ten ports), etc. It will also be understood that in other embodiments the disclosed N-way power dividers and combiners include N-port power dividers and combiners having more than ten ports, e.g., such as N-port power dividers and combiners that employ a cascaded corporate feed such as described further herein. In one embodiment, such power dividers and combiners may include a single common port, e.g., a common input port for a power divider and a common output port for a power divider. In this embodiment, the balance of the ports of a N-port power divider are electrically coupled to a common circuit node of a common input port, and the balance of the ports of a N-port power combiner are coupled to a common circuit node of a common output port.

Figures 2A, 2B:
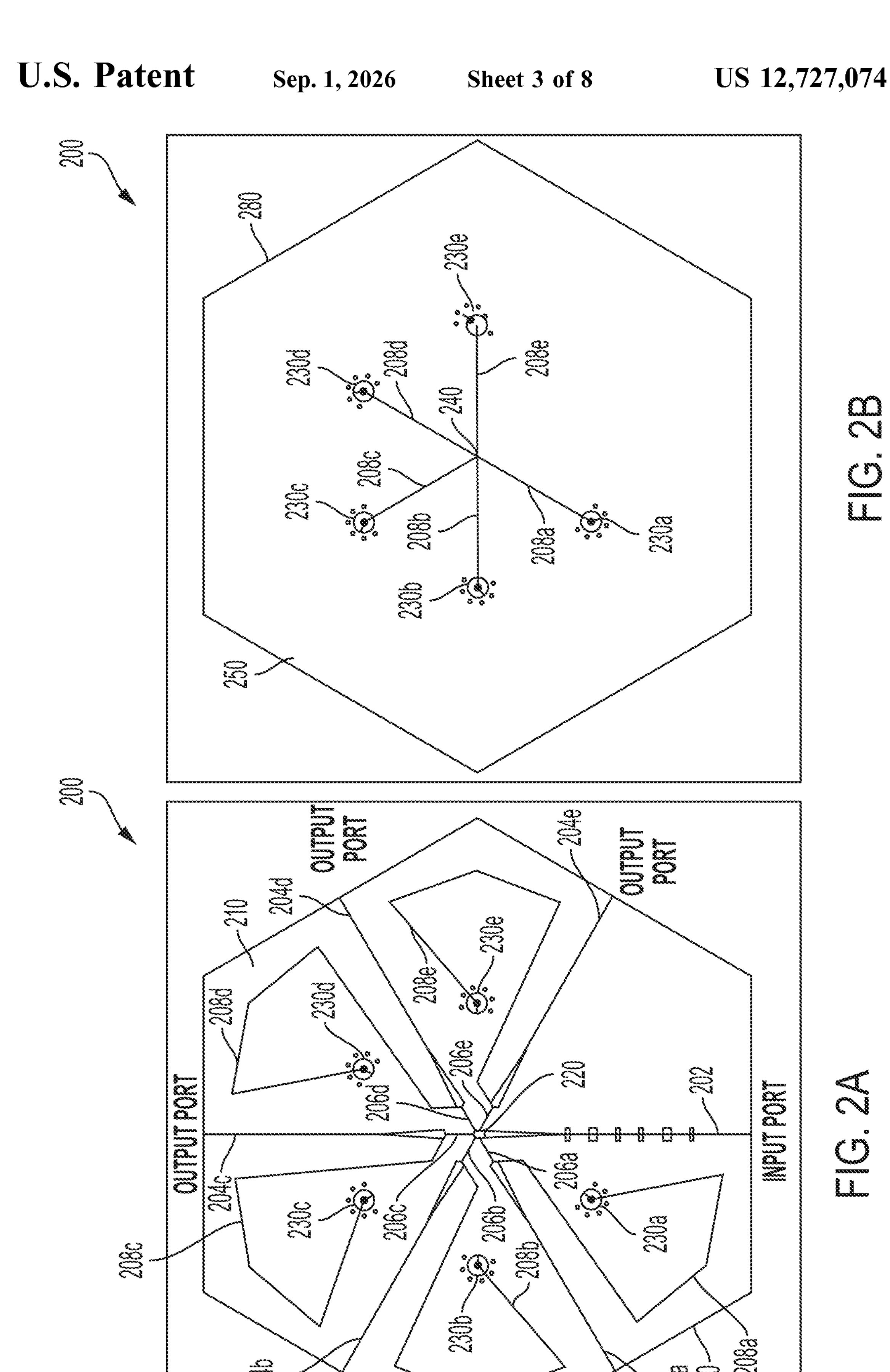
FIG. 2A illustrates an overhead sectional view of a first internal PCB layer of a five-way power divider according to one exemplary embodiment of the disclosed systems and methods.
FIG. 2B illustrates an overhead sectional view of a second internal PCB layer of a five-way power divider according to one exemplary embodiment of the disclosed systems and methods.

FIGS. 2A and 2B are overhead sectional views that illustrate one embodiment of a five-way (or six-port) power divider 200 configured on a hexagonal-shaped cross-section of a multi-layer planar PCB 280 having a first internal planar PCB layer 210 overlying (and oriented parallel to) a second internal planar PCB layer 250 that is a routing layer separated from the first internal PCB layer 210 by dielectric (electrically insulating) PCB substrate material 270*b*. In this embodiment, all electrically-conductive components of circuit 200 may be implemented by respective transmission lines of PCB 280. As shown, the five-way power divider 200 has a total of six ports, and is configured with transmission lines (e.g., striplines) that include a single input arm 202 and five output arms 204*a*-204*e* that each represent a port for the five-way (or six-port) power divider 200. As further shown, each of output arms 204*a*-204*e* is electrically coupled through a corresponding respective one of impedance transformer transmission line sections 206*a*-206*e* to the transmission line of the single input arm 202 at a circuit node 220 formed within the first PCB layer 210. Although this embodiment is described as a five-way power divider, it will be understood that a five-way (or six-port) power combiner may be similarly configured using the same circuit layout, in which case each of arms 204*a*-204*e* may be used as an input arm that is electrically coupled through a corresponding respective one of impedance transformer sections 206*a*-206*e* to the single arm 202 at a circuit node 220 used as a single output arm formed within the first PCB layer 210.

Also shown in FIGS. 2A and 2B are separate electrically conductive lossy transmission line shunts 208*a*-208*e* that are electrically coupled between output arms 204*a*-204*e* in the manner shown. Each of lossy transmission line shunts 208*a*-208*e* is partially formed within first internal PCB layer 210 and partially formed within underlying second PCB routing layer 250, and are electrically coupled or tied together at a common circuit node 240 within second internal PCB routing layer 250 as shown. As further shown, one of separate electrically-conductive vias 230*a*-230*e* is formed through PCB substrate material 270*b* to electrically couple together a respective first part of each given electrically lossy shunt 208*a*-208*e* that is formed within first PCB layer 210 to a corresponding mating second part of the given lossy shunt 208*a*-208*e* that is formed within second PCB routing layer 250 in the manner shown.

In one embodiment, each of impedance transformer sections 206*a*-206*e* may have a length that is one quarter of a voltage excitation wavelength k at the fundamental frequency ($f_0$), and the length of each lossy shunt 208*a*-208*e* may be a multiple (n) of a half wavelength ($\lambda/2$) at the fundamental frequency ($f_0$), with a combined total length of any two of lossy shunts 208*a*-208*e* (e.g., such as 208*a* and 208*b*) is a multiple of a full wavelength ($\lambda$) at the fundamental frequency ($f_0$) in a manner similar to the three-port case of FIG. 1C. Together, the combined first and second shunt parts on different layers of FIGS. 2A-2C form respective lossy transmission line shunts 208*a*-208*e* that all have the same total length (and same electrical resistance) as each other.

Returning to FIGS. 2A and 2B, input arm 202 of five-way power divider 200 corresponds to an input port of the five-way power divider circuit 200 and output arms 204*a* to 204*e* correspond to five respective output ports of the same five-way power divider circuit 200 that extend to the outer periphery of PCB layer 210. In one embodiment, PCB and transmission line materials of five-way power divider 200 of FIGS. 2A and 2B may be the same materials as described for corresponding components of three-port power divider 150 of FIGS. 1A-1C.

Figure 2C:
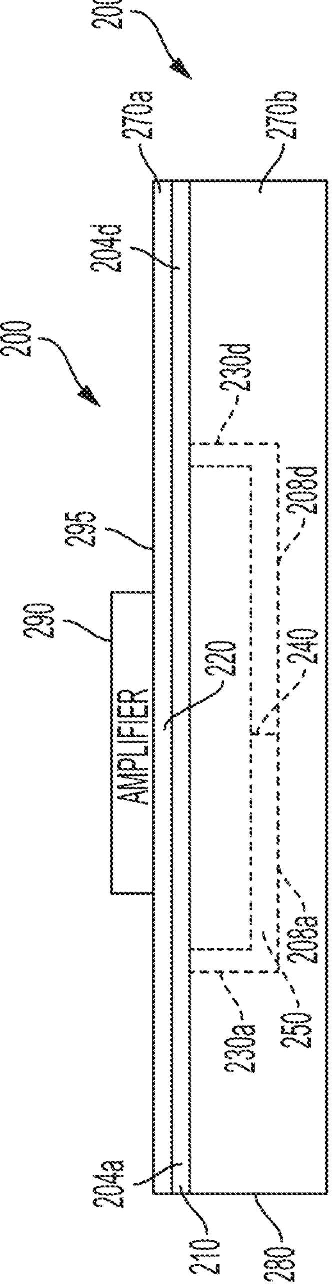
FIG. 2C illustrates a side cross-sectional view of a five-way power divider according to one exemplary embodiment of the disclosed systems and methods.

FIG. 2C is a side cross-sectional view of five-way power divider 200, showing a section of first internal planar PCB layer 210 (in solid lines) that is taken along the axis of opposing output arms 204*a* and 204*d* through circuit node 220, and showing a section of second internal planar PCB layer 250 (in dashed lines) that is taken along the axis of opposing transmission line stub sections 208*a* and 208*d* through circuit node 240. Also shown in dashed lines of FIG. 2C are cross sections of conductive vias 230*a* and 230*d* that are electrically coupled through dielectric PCB substrate material 270*b* between parts of respective stub sections 208*a* and 208*d* of second internal PCB layer 250 and corresponding parts of stub sections 208*a* and 208*d* of first internal PCB layer 210. As further shown in FIG. 2C, other circuitry 290 (e.g., discrete radio frequency amplifier circuitry or discrete processor chip implementing the same) may be mounted (e.g., by adhesive and/or solder, etc.) to an external (e.g., upper) surface 295 of PCB 280 that overlies dielectric layer 270*a* and the transmission lines (e.g., striplines) of power divider 200 since all circuitry of the power divider 200 is implemented within internal layers 210 and 250 of PCB 280, leaving the area of external surface 295 free for mounting of other circuitry 290. Other circuitry 290 may in turn be electrically coupled to the underlying internal five-way divider circuitry (e.g., to input port of input arm 202 or to one or more output ports of output arms 204) by an electrically-conductive via extending from external surface 295 of PCB 280 to the underlying five-way power divider circuitry through PCB 280.

In the embodiment of FIGS. 2A-2C, five-way power divider 200 is implemented entirely internal to a multi-layer PCB, i.e., on internal planar electrically-conductive PCB layers having respective planes that are oriented parallel to each other, and without the use of discrete resistor elements and without consuming any PCB external surface area. However, it will be understood that in other embodiments, an N-way power divider may be similarly configured with components of first PCB layer 210 (e.g., input arm 202, impedance transformer sections 206*a*-206*e*, output arms 204*a*-204*e*, and first parts of electrically lossy shunts 208*a*-208*e*) instead being implemented as microstrips on an exposed external planar layer of a PCB, and with components of second planar PCB routing layer 250 (e.g., second parts of electrically lossy shunts 208*a*-208*e*) being implemented internally as striplines within a buried planar electrically-conductive PCB layer that underlies the exposed external PCB layer, and that has a plane oriented parallel to the plane of the exposed external planar PCB layer. In such an embodiment, an N-way power divider may be implemented partially within a PCB, again without the use of discrete resistor elements. Thus, as described herein, an N-way power divider may be implemented partially or completely internal to a PCB in a manner that takes advantage of natural PCB board energy loss using distributed lossy transmission lines that dissipate radio frequency (RF) and other electromagnetic (EM) signal energy so as to provide matched outputs and good isolation, without the use of discrete resistors.

In the embodiment of FIGS. 2A-2C, the input port of input arm 202 of five-way power divider 200 may be excited in the even mode by a voltage having wavelength ($\lambda$) at the fundamental frequency ($f_0$), or by a voltage within an operational bandwidth of useable frequency around the fundamental frequency ($f_0$), or by a voltage within an operational bandwidth of useable frequency band around the fundamental frequency ($f_0$) in which degradation of impedance match and isolation is sufficiently small so as to yield adequate performance. In this embodiment, the voltage present on each end of each given lossy transmission line shunt 208*a*-208*e* is the same as the voltage present on the other end of the given lossy transmission line shunt 208*a*-208*e*, so that no power is absorbed in the lossy transmission line shunt 208*a*-208*e*. This results in the input excitation voltage being split equally between the output ports of the five output arms 204*a* to 204*e*, with only a standing wave present on the lossy transmission line shunts 208*a*-208*e*, and no real power transfer occurs through the lossy transmission line shunts 208*a*-208*e*. Therefore, power supplied at input port of input arm 202 is routed through and equally divided between each of the output ports of output arms 204*a* to 204*e*.

In the same embodiment of FIGS. 2A-2C, an output port of any given one of output arms 204*a* to 204*e* of five-way power divider 200 (e.g., such as output port of output arm 204*c*) may be excited in the odd mode by a voltage having wavelength ($\lambda$) at the fundamental frequency ($f_0$) (or by a voltage within an operational bandwidth of useable frequency band around the fundamental frequency ($f_0$) in which degradation of impedance match and isolation is sufficiently small so as to yield adequate performance), while at the same time no excitation is applied to the output ports of the four other remaining arms (e.g., output ports of output arms 204*a*, 204*b*, 204*d* and 204*e*). In this embodiment, some power from the output excitation voltage is routed from the given output arm (e.g., 204*c* in this example) through each of the lossy transmission line shunts 208*a*-208*e*, where it is completely dissipated as heat so that no power is provided to the output ports of any of the four remaining non-excited arms (e.g., output ports of output arms 204*a*, 204*b*, 204*d* and 204*e*). Remaining power is provided to the input port of input arm 202. Thus, power is provided from the excited output port of the given output arm (e.g., output arm 204*c* in this example) to the input port of input arm 202, while output excitation is routed through the resistive shunts so that the output ports of the four other non-excited output arms (e.g., output ports of output arms 204*a*, 204*b*, 204*d* and 204*e*) are isolated from the excitation applied at the output port of the given output arm (e.g., output arm 204*c*).

It will be understood that the five-way (or six-port) power divider embodiment of FIGS. 2A-2C is exemplary only, and that an N-way power divider may be similarly configured in other embodiments with more or less than six ports, e.g., with a single input port and input arm coupled to more or less than five output arms and corresponding output ports that are coupled together by a corresponding number of lossy transmission line shunts. It will also be understood that the transmission line layout geometry of an N-way power divider may be different than the hexagonal configuration illustrated in FIGS. 2A and 2B. In either case, the same circuit layout may be implemented as a N-way power combiner with a single output port and output arm coupled to more or less than five input arms and corresponding input ports that are coupled together by a corresponding number of lossy transmission line shunts.

It will also be understood that in other N-way power divider embodiments, geometry (e.g., length and/or width) of different transmission lines 102, 104, 106 and 108 may vary from each other to achieve different and unequal characteristic impedances for an unequal N-way power divider so that the N-way power divider divides power unequally between different output ports, e.g., to divide power unequally between a first amount (e.g., 60% or other greater or lesser percentage) of the total input power to a first output port of a first output arm 204 that is directly coupled to the first lossy transmission line shunt 208 and a different second amount (e.g., 40% or other greater or lesser percentage) of the total input power to a second output port of a second output arm 204 that is directly coupled to the second lossy transmission line shunt 208. Likewise, the same circuit layout may be implemented as an N-way power combiner that combines received power unequally between different input ports.

The disclosed N-way power dividers combiners may be implemented at least partially internal to and within a PCB to divide a single electromagnetic (EM) input signal into multiple different EM output signals (i.e., in the case of a N-way power divider) or to combine multiple different EM input signals into a single EM output signal (i.e., in the case of a N-way power combiner). Examples of systems in which the disclosed power dividers may be so employed include, but are not limited to, radio receiver or transmitter circuitry, EM signal processing circuitry, multiple antenna or corporate feed systems, etc. In such systems, at least a portion of an N-way power divider or combiner may be implemented internal to a PCB, such that other system circuitry may be mounted on an external surface of the PCB in a position that overlies or underlies (or is otherwise coextensive with) at least a portion of the N-way power divider or combiner circuitry that is internal to the PCB, and electrically coupled to the N-way power divider or combiner circuitry through the PCB. Examples of such other system circuitry includes, but is not limited to, amplifier circuitry, antenna feed network circuitry, synthesizer circuitry, etc.

Figures 3, 4:
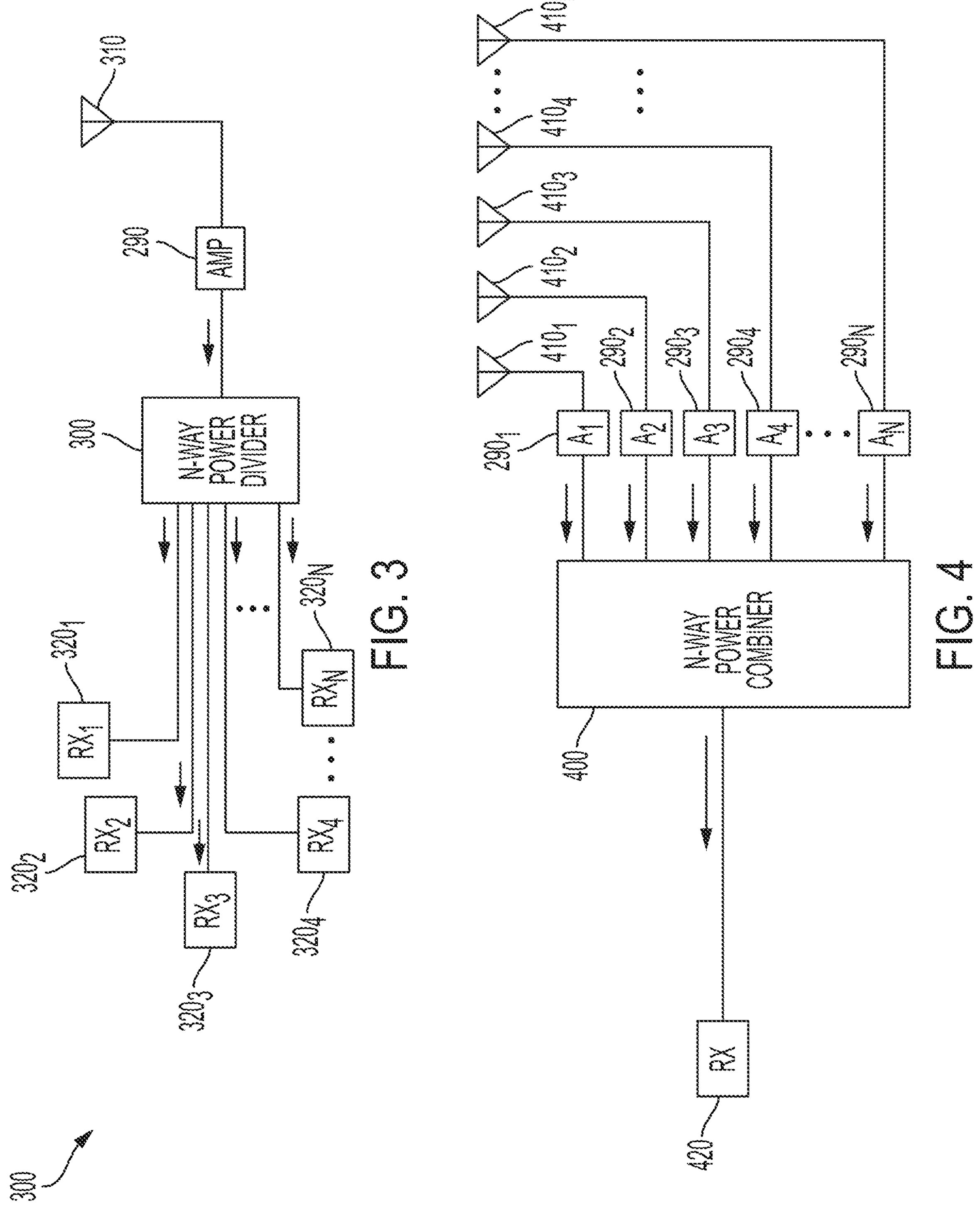
FIG. 3 illustrates a system according to one exemplary embodiment of the disclosed systems and methods.
FIG. 4 illustrates a system according to one exemplary embodiment of the disclosed systems and methods.

FIG. 3 illustrates a possible example of a system that may include an N-way power divider such as described herein, FIG. 4 illustrates a possible example of a system that may include an N-way power combiner such as described herein. However, it will be understood that the systems of FIGS. 3 and 4 are exemplary only, and that other types of systems may be implemented using the N-way power dividers and combiners described herein, including N-way power dividers and combiners having two or more output ports as described herein.

FIG. 3 illustrates one exemplary embodiment of a RF (e.g., microwave) receiving system 300 that includes a N-way power divider 300 provided internally within a PCB 280 such as described and illustrated in FIGS. 2A-2C. In the embodiment of FIG. 3, N-way power divider 300 has a single input port coupled to receive an amplified RF signal from a RF antenna 310 via an active power source in the form of discrete signal amplifier 290. The N-way power divider 300 of FIG. 3 is also configured to divide this received RF signal into five equal RF signals that are provided at its five output ports to respective separate respective additional circuitry in the form of five separate respective RF receivers 320*a*-320*e* as shown. Each of receivers 320*a*-320*e* may include circuitry for processing RF signals, e.g., such as one or more filter/s, mixer/s for down conversion to intermediate frequency (IF) and/or baseband frequency, analog to digital converter (ADC) circuitry, baseband processor, etc. Each of receivers 320*a*-320*e* may produce digital data from the received RF signal and provide this data to other processing circuitry (not shown), such as microcontroller/s, central processing unit/s (CPUs), etc. In one embodiment, amplifier 290 may include discrete circuitry that is mounted on the external surface of PCB 280 over transmission line circuitry of N-way power divider 300, e.g., in the manner of other circuitry 290 shown in FIG. 2C.

FIG. 4 illustrates another exemplary embodiment of a RF (e.g., microwave) receiving system 400 that includes a N-way power combiner 400 provided internally within a PCB 280 such as described and illustrated in FIGS. 2A-2C. However, in the embodiment of FIG. 4, N-way power combiner 400 has each of its five input ports coupled to separately receive a RF signal from a different respective one of multiple RF antennas 410*a*-410*e* via a separate active power source in the form of a discrete signal amplifier 290*a*-290*e*. The N-way power combiner 400 of FIG. 4 is also configured to combine these separately received and amplified RF signals into a single combined RF signal that is provided at its single output port to additional circuitry in the form of a single receiver 420 as shown. As in the embodiment of FIG. 3, receiver 420 of FIG. 4 may include circuitry for processing the RF signal, e.g., such as one or more filter/s, mixer/s for down conversion to intermediate frequency (IF) and/or baseband frequency, analog to digital converter (ADC) circuitry, baseband processor, etc. Receiver 420 may also produce digital data from the received RF signal and provide this data to other processing circuitry (not shown), such as microcontroller/s, central processing unit/s (CPUs), etc. In one embodiment, one or more of amplifiers 290*a*-290*e* may include discrete circuitry that is mounted on the external surface of PCB 280 over transmission line circuitry of N-way power combiner 400, e.g., in the manner of other circuitry 290 shown in FIG. 2C.

Although FIGS. 3 and 4 illustrate a system employing an active power source to feed an input port or output ports of a N-way power divider or combiner (respectively), it will be understood that one or more passive power sources (e.g., such as one or more RF antennas which capture and provide power from a RF signal) may alternatively be used to feed an input port or one or more output ports of a N-way power divider or combiner (respectively).

Figure 5:
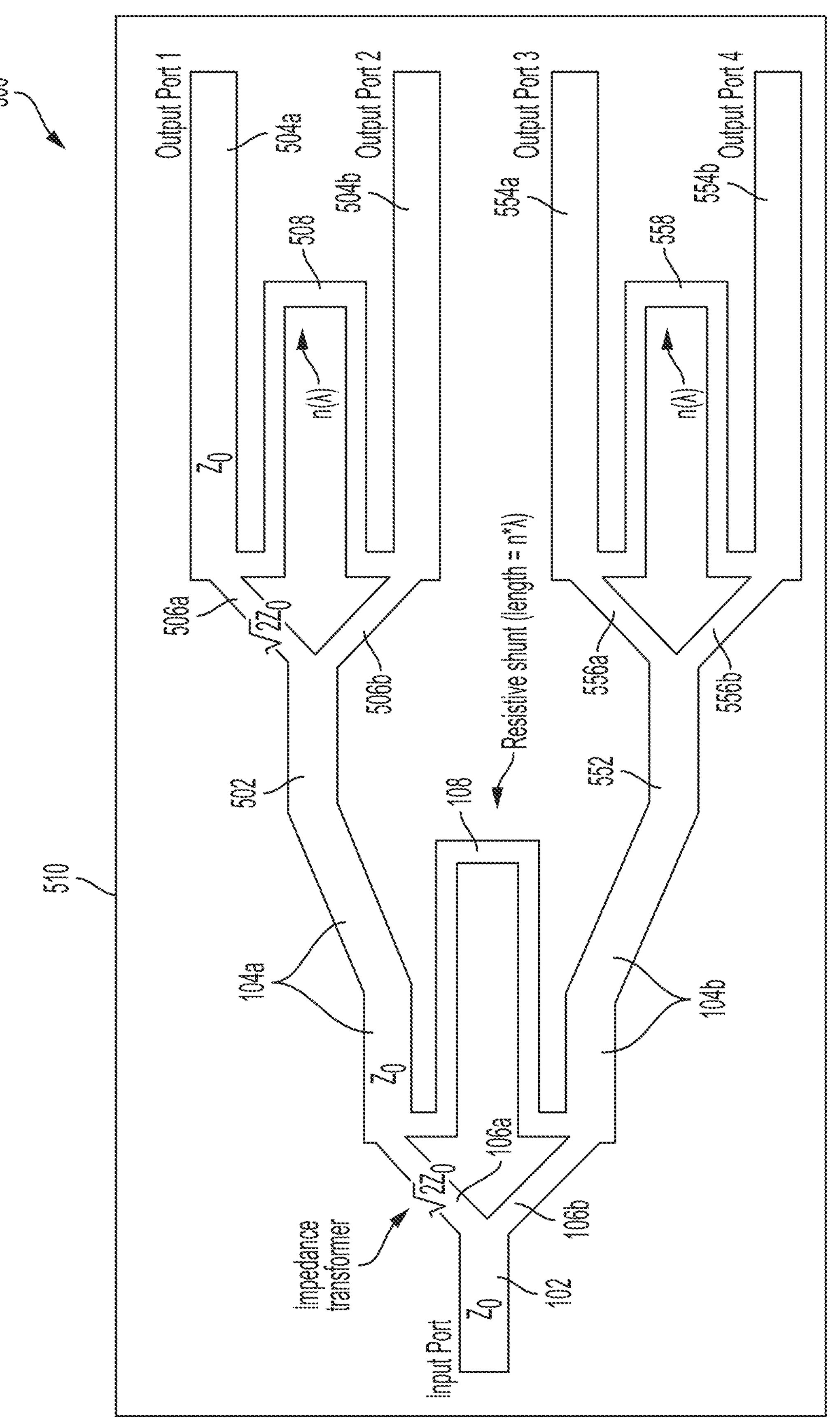
FIG. 5 illustrates an overhead view of a four-way power divider according to one exemplary embodiment of the disclosed systems and methods in a cascaded corporate feed configuration.

FIG. 5 illustrates an embodiment of a four-way (or five port) power divider circuit 500 as it may be configured using distributed transmission lines disposed on and/or contained within a PCB 510 in a "corporate feed" architecture that includes three two-way power dividers having a Wilkinson-type configuration that are coupled together in a cascaded arrangement. In this embodiment all electrically-conductive components of circuit 500 may be implemented by respective transmission lines of PCB 510. As shown in FIG. 5, a first two-way (three-port) power divider similar to the embodiment of FIGS. 1A-1C has its output arms 104*a* and 104*b* electrically coupled to respective input arms 502 and 552 of second and third dividers as shown. Each of the second and third dividers is a two-way (three-port) power divider that is also similar to the embodiment of FIGS. 1A-1C, with the second power divider having respective impedance transformer sections 506*a* and 506*b* coupled between its input arm 502 and its output arms 504*a* and 504*b*, and with the second power divider having respective impedance transformer sections 556*a* and 556*b* coupled between its input arm 552 and output arms 554*a* and 554*b*. As shown in FIG. 5, the second power divider has a respective resistive shunt 508 electrically coupled between its output arms 504*a* and 504*b*, and the third power divider has a resistive shunt 558 electrically coupled between its output arms 554*a* and 554*b*.

In the embodiment of FIG. 5, the input arm 102 of the first power divider corresponds to an input port of four-way power divider circuit 500, and the output arms 504*a* and 504*b* (of the second power divider circuit) and output arms 554*a* and 554*b* (of the third power divider circuit) correspond to the output ports of the four-way power divider circuit 500. As described herein in relation to other embodiments, all or a portion of the transmission lines of power divider circuit 500 may be implemented internally to a PCB with no discrete resistor elements, e.g., with the power divider circuitry being confined to a single PCB layer and completely internal with resistive shunt instead of discrete resistors. Further, four-way power divider 500 of FIG. 5 may be implemented as a four-way power combiner by reversing the signal directions so that it has four input arms 504*a*, 504*b*, 554*a* and 554*b*, and a single output arm 102. In one embodiment, power-divider 500 may be used for an antenna array feed structure.

Although FIG. 5 illustrates one exemplary embodiment of a four-way (or five port) power divider circuit configured with a cascaded corporate feed architecture, it will be understood that a cascaded corporate feed configuration may be used multiple times successively (e.g., to feed large arrays) by electrically coupling an input arm of a different additional two-way power divider circuit similar to the embodiment of FIGS. 1A-1C to each respective output arm of a cascaded corporate feed power divider circuit (e.g., such as power divider circuit 500) so as to create a larger power divider circuit having more than four output arms (e.g., such as an eight-way divider circuit, sixteen-way divider circuit, 32-way divider circuit, etc.).

It will also be understood that a cascaded corporate feed configuration may employ one or more divider circuits having odd numbers of output ports, or one or more combiner circuits having odd numbers of input ports. A cascaded corporate feed configuration may also employ one or more N-way divider or combiner circuits in which "N" is greater than two. For example, in one embodiment a first two-way (three-port) power divider similar to the embodiment of FIGS. 1A-1C may have its output arms 104*a* and 104*b* electrically coupled to respective input arms of second and third dividers, with the second divider being a two-way (three-port) power divider and with the third divider being a three-way (four-port) power divider, so as to form a five-way (six-port) power divider having an unequal power split among the five output ports, i.e., the second two-way power divider splits half the power from the first power divider equally among its two output ports and the third three-way splitter splits the other half of the power from the first power divider equally among its three output ports. Other cascaded corporate feed configurations are possible that employ one or more N-way divider circuits or N-way combiner circuits in which "N" is greater than two and/or "N" is an odd integer number.

Figure 6:
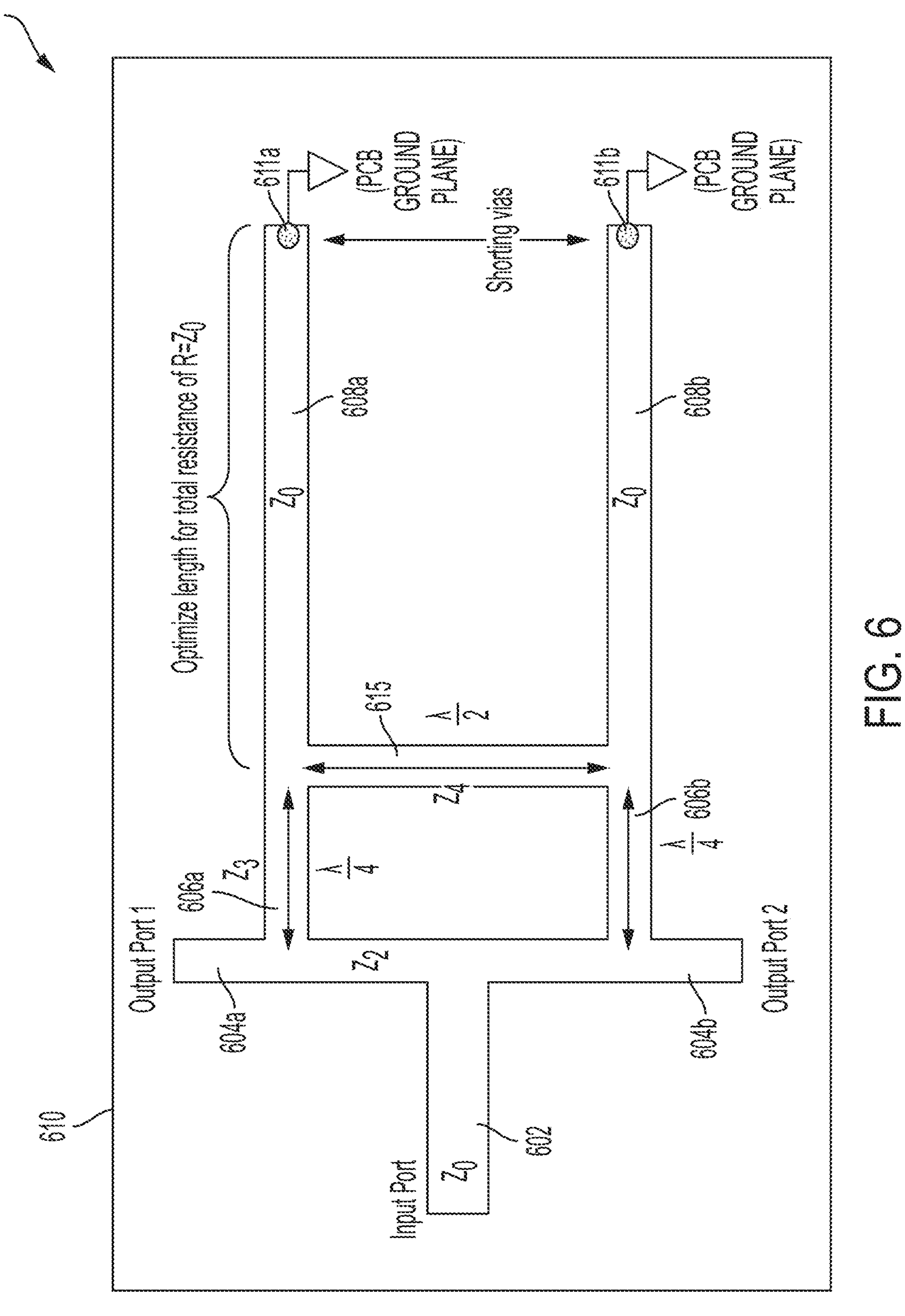
FIG. 6 illustrates an overhead view of a two-way power divider according to one exemplary embodiment of the disclosed systems and methods.

FIG. 6 illustrates an embodiment of a two-way (or three-port) power divider circuit 600 as it may be configured in a Gysel-type divider configuration using distributed electrically-conductive transmission lines disposed on and/or contained within a PCB 610. In this embodiment all electrically-conductive components of circuit 600 may be implemented by respective transmission lines of PCB 610. In some embodiments, a Gysel-type divider may be employed to provide a broader operational frequency bandwidth than a Wilkinson-type divider.

As shown in FIG. 6, power divider 600 has an input arm 602 corresponding to an input port that is electrically coupled to output ports of respective output arms 604*a* and 604*b*. Respective impedance transformer sections 606*a* and 606*b* are coupled as shown between lossy transmission line resistive shunts 608*a* and 608*b* and input arm 602. In FIG. 6, lossy transmission line resistive shunt 608*a* is coupled between impedance transformer section 606*a* and a first shorting via 611*a* that is electrically coupled to one or more adjacent ground plane layers of the PCB. Similarly, lossy transmission line resistive shunt 608*b* is coupled between impedance transformer section 606*b* and a second shorting via 611*b* that is electrically coupled to one or more adjacent ground plane layers of the PCB. An additional shunt 615 is coupled as shown in FIG. 6 at a first node positioned between impedance transformer section 606*a* and resistive shunt 608*a*, and at a second node positioned between impedance transformer section 606*b* and resistive shunt 608*b*. In the embodiment of FIG. 6, there is no frequency dependence on the length of resistive shunts 608*a* and 608*b*, which allows for better optimization of the resistive shunt length for total resistance $Z_0$. Further, two-way power divider 600 of FIG. 6 may be implemented as a two-way power combiner by reversing the signal directions so that it has two input arms 604*a* and 604*b*, and a single output arm 602.

Figure 7:
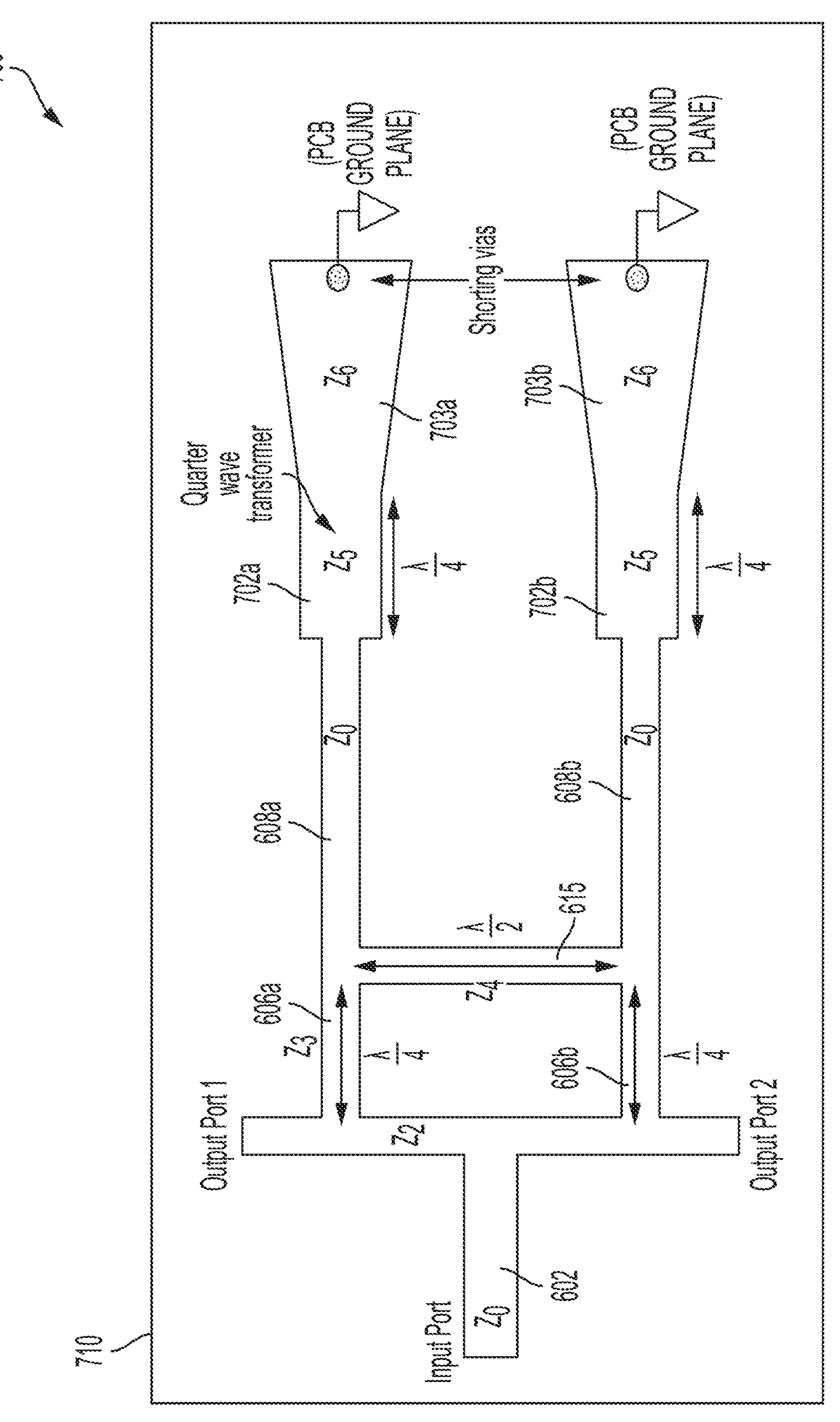
FIG. 7 illustrates an overhead view of a two-way power divider according to one exemplary embodiment of the disclosed systems and methods.

FIG. 7 illustrates another embodiment of a two-way (or three-port) power divider circuit 600 as it may be configured in a Gysel-type divider configuration, using distributed electrically-conductive transmission lines disposed on and/or contained within a PCB 710. In the embodiment of FIG. 7, a transmission line layout similar to FIG. 6 is employed, with the exception that additional quarter-wave stepped impedance transformers 702*a* and 702*b* are provided near the terminal ends of each of the respective resistive shunt sections 608*a* and 608*b* as shown. In the embodiment of FIG. 7, each of quarter-wave stepped impedance transformers 702*a* and 702*b* is an electrically-conducive transmission line section that is wider than the primary transmission line section of resistive shunt section 608*a* and 608*b* that is coupled to the respective quarter wave impedance transformers 606*a* and 606*b* as shown. In this way, each of quarter-wave stepped impedance transformers 702*a* and 702*b* converts the impedance of its respective primary resistive shunt section 608*a* and 608*b* to a lower impedance value, i.e., most signal loss occurs in the narrower primary transmission line sections 608*a* and 608*b*. Further, two-way power divider 700 of FIG. 7 may be implemented as a two-way power combiner by reversing the signal directions so that it has two input arms 604*a* and 604*b*, and a single output arm 602.

In the embodiment of FIG. 7, optional tapered impedance transformers 703*a* and 703*b* are also shown present at the terminal ends of each of the respective resistive shunt sections 608*a* and 608*b* as shown, e.g., so that less total loss is required to terminate a lower impedance line (shorter length overall). Thus, it is possible that each given resistive shunt section may have one or more transformer sections, and/or that such transformer section may be stepped and/or tapered. It will be understood that one or more stepped or tapered resistive shunts may be employed in Wilkinson, Gysel, or other types of resistive dividers or combiners.

It will be understood that one or more of the tasks, functions, or methodologies described herein (e.g., including those described herein for a baseband processor, ADC circuitry, etc.) may be implemented by circuitry and/or by a computer program of instructions (e.g., computer readable code such as firmware code or software code) embodied in a non-transitory tangible computer readable medium (e.g., optical disk, magnetic disk, non-volatile memory device, etc.), in which the computer program comprising instructions is configured when executed on a processing device in the form of a programmable integrated circuit (e.g., processor such as CPU, microcontroller, microcontroller, microprocessor, ASIC, etc. or programmable logic device "PLD" such as FPGA, complex programmable logic device "CPLD", etc.) to perform one or more steps of the methodologies disclosed herein. In one embodiment, a group of such processing devices may be selected from the group consisting of CPU, microcontroller, microprocessor, FPGA, CPLD and ASIC. The computer program of instructions may include an ordered listing of executable instructions for implementing logical functions in a computer system or component thereof. The executable instructions may include a plurality of code segments operable to instruct components system components to perform the methodologies disclosed herein.

It will also be understood that one or more steps of methodologies implemented by a programmable integrated circuit may be performed using one or more code segments of the computer program. For example, a code segment executed by a programmable integrated circuit may include one or more method steps. It will be understood that a programmable integrated circuit may be configured to execute or otherwise be programmed with software, firmware, logic, and/or other program instructions stored in one or more non-transitory tangible computer-readable mediums (e.g., data storage devices, flash memories, random update memories, read only memories, programmable memory devices, reprogrammable storage devices, hard drives, floppy disks, DVDs, CD-ROMs, and/or any other tangible data storage mediums) to perform the operations, tasks, functions, or actions described herein for the disclosed embodiments.

While the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as being the appended claims. Moreover, the different aspects of the disclosed antennas, systems and methods may be utilized in various combinations and/or independently. Thus, the invention is not limited to only those combinations shown herein, but rather may include other combinations.

What is claimed is:

1. A circuit, comprising:

an input arm defined as an electrically-conductive transmission line on or within a printed circuit board (PCB);

multiple output arms electrically coupled to the input arm, each of the multiple output arms being defined as a separate electrically-conductive transmission line on or within the PCB;

multiple impedance transformers defined as separate respective electrically-conductive transmission lines on or within the PCB; and at least one resistive shunt electrically coupled between each one of the multiple impedance transformers and a ground plane of the PCB, the resistive shunt being one or more electrically-conductive transmission lines defined on or within the PCB, and each of the impedance transformers being electrically coupled between a respective one of the resistive shunts and the input arm.

2. The circuit of claim 1, where the at least one resistive shunt comprises a first resistive shunt and a second resistive shunt; where the multiple output arms comprise a first output arm and a second output arm; where the multiple impedance transformers comprise a first impedance transformer electrically coupled between the first output arm and the first resistive shunt, and a second impedance transformer electrically coupled between the second output arm and the second resistive shunt; where the first resistive shunt is electrically coupled between the first impedance transformer and the ground plane; and where the second resistive shunt is electrically coupled between the second impedance transformer and the ground plane.

3. The circuit of claim 2, where the circuit further comprises an additional shunt electrically coupled between a first circuit node and a second circuit node, the first circuit node being positioned between the first impedance transformer and the first resistive shunt, and the second circuit node being positioned between the second impedance transformer and the second resistive shunt.

4. The circuit of claim 1, where the at least one resistive shunt comprises multiple separate resistive shunts that each correspond to one of the multiple output arms; where each of the multiple separate resistive shunts is electrically coupled at a first end to a corresponding one of the multiple impedance transformers and electrically coupled at a second end to the ground plane of the PCB with each of the multiple impedance transformers being electrically coupled between a corresponding one of the multiple output arms and a corresponding one of the multiple separate resistive shunts.

5. The circuit of claim 4, where each of the multiple separate resistive shunts is electrically coupled between a corresponding one of the multiple impedance transformers and a corresponding via that is electrically coupled to at least one ground plane layer of the ground plane of the PCB.

6. The circuit of claim 1, where the circuit further comprises an additional impedance transformer that is electrically coupled between each respective one of the resistive shunts and the ground plane of the PCB, each of the additional impedance transformers being defined as a separate respective electrically-conductive transmission line on or within the PCB that has a first end that is positioned adjacent the ground plane of the PCB and that has an opposite second end that is positioned between the first end and a respective one of the resistive shunts; and where the first end of the additional impedance transformer is wider than the respective one of the resistive shunts.

7. The circuit of claim 6, where the additional impedance transformer is at least one of a stepped or tapered impedance transformer.

8. The circuit of claim 1, where each of the input arm, each of the multiple output arms and each of the multiple impedance transformers are defined as an electrically-conductive transmission line contained within the PCB.

9. The circuit of claim 1, where the circuit implements a power divider circuit having no discrete resistive elements; where the input arm comprise an input port to the power divider; and where the multiple output arms comprise multiple respective output ports of the power divider.

10. The circuit of claim 1, where each of the multiple impedance transformers has a length that is one quarter of a wavelength ($\lambda$) at the fundamental frequency ($f_0$); and where a resistance value of the resistive shunt is equal to a characteristic impedance ($Z_0$) at the fundamental frequency ($f_0$) of the circuit.

11. The circuit of claim 1, where the circuit further comprises the at least one resistive shunt electrically coupled between each one of the multiple output arms and the ground plane of the PCB, the resistive shunt being one or more electrically-conductive transmission lines defined on or within the PCB, and each of the impedance transformers being electrically coupled between a respective one of the multiple output arms and a respective one of the resistive shunts.

12. A method, comprising either one of:

providing input power to an input port of a power divider circuit, and receiving a portion of the provided input power from each given one of multiple separate and different output ports of the power divider circuit; or providing input power to each given one of the multiple separate and different output ports of the power divider circuit, and receiving at the input port of the power divider circuit a combination of the input power provided to each given one of the multiple separate and different output ports of the power divider circuit;

where the power divider circuit comprises:

an input arm comprising the input port and defined as an electrically-conductive transmission line on or within a printed circuit board (PCB), multiple output arms comprising the multiple respective output ports of the power divider and being electrically coupled to the input arm, each of the multiple output arms being defined as a separate electrically-conductive transmission line on or within the PCB, multiple impedance transformers defined as separate respective electrically-conductive transmission lines on or within the PCB, and at least one resistive shunt electrically coupled between each one of the multiple impedance transformers and a ground plane of the PCB, the resistive shunt being one or more electrically-conductive transmission lines defined on or within the PCB, and each of the impedance transformers being electrically coupled between a respective one of the resistive shunts and the input arm.

13. The method of claim 12, comprising providing the input power to each given one of the multiple separate and different output ports of the power divider circuit from a corresponding separate and different power source electrically-coupled to the given one of the separate and different output ports of the power divider circuit; and receiving a combination of the input power provided to each given one of the separate and different output ports of the power divider circuit in an additional circuit that is electrically-coupled to the input port of the power divider circuit.

14. The method of claim 13, where all circuit components of the power divider circuit are implemented in at least one internal layer of PCB; where the power divider circuit comprises no discrete resistive elements; and where at least a portion of the corresponding separate and different power sources or the additional circuit is mounted to an external surface of the PCB in a position that is coextensive with at least a portion of the power divider circuit.

15. The method of claim 13, where the at least one resistive shunt comprises a first resistive shunt and a second resistive shunt; where the multiple output arms comprise a first output arm and a second output arm; where the multiple impedance transformers comprise a first impedance transformer electrically coupled between the first output arm and the first resistive shunt, and a second impedance transformer electrically coupled between the second output arm and the second resistive shunt; where the first resistive shunt is electrically coupled between the first impedance transformer and the ground plane; where the second resistive shunt is electrically coupled between the second impedance transformer and the ground plane; and where the power divider circuit further comprises an additional shunt electrically coupled between a first circuit node and a second circuit node, the first circuit node being positioned between the first impedance transformer and the first resistive shunt, and the second circuit node being positioned between the second impedance transformer and the second resistive shunt.

16. The method of claim 12, comprising providing the input power to the input port of the power divider circuit from at least one power source that is electrically coupled to the input port of the power divider circuit, and receiving a portion of the provided input power from each given one of the multiple separate and different output ports of the power divider circuit in a corresponding respective separate additional circuit that is electrically-coupled to the given one of the separate and different output ports of the power divider circuit.

17. The method of claim 16, where all circuit components of the power divider circuit are implemented in at least one internal layer of PCB; where the power divider circuit comprises no discrete resistive elements; and where at least one of the power source or at least a portion of the corresponding respective separate additional circuits is mounted to an external surface of the PCB in a position that is coextensive with at least a portion of the power divider circuit.

18. The method of claim 12, where the power divider circuit further comprises an additional impedance transformer that is electrically coupled between each respective one of the resistive shunts and the ground plane of the PCB, each of the additional impedance transformers being defined as a separate respective electrically-conductive transmission line on or within the PCB that has a first end that is positioned adjacent the ground plane of the PCB and that has an opposite second end that is positioned between the first end and a respective one of the resistive shunts; and where the first end of the additional impedance transformer is wider than the respective one of the resistive shunts.

19. The method of claim 18, where the additional impedance transformer is at least one of a stepped or tapered impedance transformer.

20. The method of claim 12, where the at least one resistive shunt of the power divider circuit comprises multiple separate resistive shunts that each correspond to one of the multiple output arms; where each of the multiple separate resistive shunts is electrically coupled at a first end to a corresponding one of the multiple impedance transformers and electrically coupled at a second end to the ground plane of the PCB with each of the multiple impedance transformers being electrically coupled between a corresponding one of the multiple output arms and a corresponding one of the multiple separate resistive shunts.

21. The method of claim 12, where the power divider circuit further comprises the at least one resistive shunt electrically coupled between each one of the multiple output arms and the ground plane of the PCB, the resistive shunt being one or more electrically-conductive transmission lines defined on or within the PCB, and each of the impedance transformers being electrically coupled between a respective one of the multiple output arms and a respective one of the resistive shunts.

22. A system, comprising:

a planar printed circuit board (PCB);

a power divider circuit comprising:

an input arm defined as an electrically-conductive transmission line on or within the PCB and the input arm providing an input port for the power divider circuit, multiple output arms electrically coupled to the input arm with each of the multiple output arms being defined as a separate electrically-conductive transmission line on or within the PCB and each of the multiple output arms providing a separate and different output port for the power divider circuit, and multiple impedance transformers defined as separate respective electrically-conductive transmission lines on or within the PCB; and at least one power source;

where the power divider circuit further comprises at least one resistive shunt electrically coupled between each one of the multiple impedance transformers and a ground plane of the PCB, the resistive shunt being one or more electrically-conductive transmission lines defined on or within the PCB, and each of the impedance transformers being electrically coupled between a respective one of the resistive shunts and the input arm; and where either one of:

the at least one power source is electrically coupled to the input port of the power divider circuit and providing input power to the input port of the power divider circuit, and a separate and different additional circuit electrically-coupled to each given one of the separate and different output ports of the power divider circuit and receiving a portion of the provided input power from the given one of the separate and different output ports of the power divider circuit, or the at least one power source comprises a separate and different power source electrically-coupled to each given one of the separate and different output ports of the power divider circuit and providing input power to the given one of the separate and different output ports of the power divider circuit, and an additional circuit electrically-coupled to the input port of the power divider circuit and receiving at the input port of the power divider circuit a combination of the input power provided to each given one of the separate and different output ports of the power divider circuit.

23. The system of claim 22, where the at least one power source is electrically coupled to the input port of the power divider circuit and providing input power to the input port of the power divider circuit, and a separate and different additional circuit electrically-coupled to each given one of the separate and different output ports of the power divider circuit and receiving a portion of the provided input power from the given one of the separate and different output ports of the power divider circuit.

24. The system of claim 22, where the at least one power source comprises a separate and different power source electrically-coupled to each given one of the separate and different output ports of the power divider circuit and providing input power to the given one of the separate and different output ports of the power divider circuit, and an additional circuit electrically-coupled to the input port of the power divider circuit and receiving at the input port of the power divider circuit a combination of the input power provided to each given one of the separate and different output ports of the power divider circuit.

25. The system of claim 22, where all circuit components of the power divider circuit are implemented in at least one internal layer of PCB; where the power divider circuit comprises no discrete resistive elements; and where the at least one power source is mounted to an external surface of the PCB in a position that overlies or underlies the power divider circuit.

26. The system of claim 22, where the at least one resistive shunt of the power divider circuit comprises multiple separate resistive shunts that each correspond to one of the multiple output arms; where each of the multiple separate resistive shunts is electrically coupled at a first end to a corresponding one of the multiple impedance transformers and electrically coupled at a second end to the ground plane of the PCB with each of the multiple impedance transformers being electrically coupled between a corresponding one of the multiple output arms and a corresponding one of the multiple resistive shunts.

* * * * *